United States Patent [19]
Maeda

[11] Patent Number: 5,115,760
[45] Date of Patent: May 26, 1992

[54] DEVELOPER MATERIAL COATING APPARATUS HAVING DEVELOPER MATERIAL REMOVING UNIT

[75] Inventor: Masataka Maeda, Kounan, Japan

[73] Assignee: Brother Kogyo Kabushiki Kaisha, Aichi, Japan

[21] Appl. No.: 500,903

[22] Filed: Mar. 29, 1990

[30] Foreign Application Priority Data

Apr. 1, 1989 [JP] Japan ................................. 1-81741

[51] Int. Cl.$^5$ ........................................... G03G 15/06
[52] U.S. Cl. ..................................... 118/621; 118/638; 118/652; 118/653
[58] Field of Search ............... 118/50.1, 621, 624.5, 118/638, 644, 647.9, 651-653, 661, 665-667, 669, 677-679; 355/73, 245, 259, 265, 312

[56] References Cited

U.S. PATENT DOCUMENTS

| | | | |
|---|---|---|---|
| 3,645,618 | 2/1972 | Lancia et al. | 118/652 |
| 3,690,758 | 9/1972 | Knechtel et al. | 355/312 |
| 3,909,864 | 10/1975 | Tanaka et al. | 15/256.52 |
| 4,378,728 | 4/1983 | Berkmann | 118/634 |
| 4,797,335 | 1/1989 | Hiratsuka et al. | 118/653 |

Primary Examiner—Michael G. Wityshyn
Assistant Examiner—Charles K. Friedman
Attorney, Agent, or Firm—Oliff & Berridge

[57] ABSTRACT

A developer material coating apparatus includes a support member feeding unit for feeding the support member to a developer material coating region while carrying the support member thereon, a developer material coating unit for triboelectrically charging the developer material and electrostatically supplying the charged developer material toward the support member feeding unit to coat the developer material on the surface of the support member in the developer material coating region, and a developer material removing unit for sucking and removing the developer material attached to said support member feeding means, except for the developer material attached to the surface of the support member. The developer material removing unit comprises an air nozzle for sucking the developer material attached to the support member feeding unit under a negative pressure, a trap case intercommunicating with the air nozzle for withdrawing the sucked developer material through the air nozzle, an air filter provided in the trap case for trapping the sucked developer material and a negative pressure producing unit intercommunicating with the trap case for producing a negative pressure in said air nozzle to produce an air flow in a predetermined direction.

18 Claims, 3 Drawing Sheets

DEVELOPER MATERIAL COATING APPARATUS HAVING DEVELOPER MATERIAL REMOVING UNIT

BACKGROUND OF THE INVENTION

This invention relates to a developer material coating apparatus for coating a support member such as a plain paper with granular developer material, and more particularly to a developer material coating apparatus having a developer material removing unit.

There has been recently utilized a color copying machine in which a color image is formed on a support member such as plain paper using granular developer material and a microcapsule sheet. A color image forming process of this type of color copying machine is as follows. A developer sheet is beforehand formed by coating the developer material on the support member such as plain paper, and the microcapsule sheet is exposed through an original to light to form a latent image on the microcapsule sheet. The microcapsule sheet having the latent image thereon and the developer sheet comprising the support member coated with the developer material are fed to a pressure-developing unit while contacted with each other under pressure. In the pressure-developing unit, the microcapsule sheet and the developer sheet are subjected to a pressure-developing process to develop the latent image on the microcapsule sheet into a visible color image on the developer sheet. Thereafter, the developer sheet having the visible color image thereon is fed to a heat-fixing unit to thermally fix the visible color image on the developer sheet. The developer material is formed of, for example, acid clay, binder and so on, and thus the developer sheet may comprise the support member coated with the developer material formed of the acid clay, the binder and so on.

As described above, this type of color copying machine requires a process for coating the developer material on the support member such as plain paper, and thus a coating apparatus therefor. As a coating apparatus, there has been conventionally used a coating apparatus in which the developer material on the support member is charged with triboelectrification and then is electrostatically coated on the support member.

FIG. 1 shows a conventional coating apparatus for coating the developer material on the support member such as plain paper. This coating apparatus comprises, for example, a support member feeding unit for feeding the support member to a developer material coating region in which the support member is electrostatically coated with the developer material and then discharging the support member coated with the developer material to an outside of the coating apparatus, and a developer material coating unit for triboelectrically charging the developer material and electrostatically supplying the charged developer material to the support member which has been fed to the developer material coating region.

The developer material coating unit comprises a tank for accommodating the developer material S therein, a carry roller 52 for carrying the developer material thereon and a supply roller 51 for triboelectrically charging the developer material in cooperation with the carry roller 52 and supplying the charged developer material to the carry roller 52. The carry roller 52 is grounded as shown in FIG. 1. The carry roller 52 and the supply roller 51 are rotatably contacted with each other at the peripheral surfaces thereof, and the developer material S is triboelectrically charged at a predetermined polarity (positively or negatively) at the contacted surfaces of the rollers 51 and 52 through a friction between the surface of the carry roller 52 and the developer material S. The charged developer material S is attached to peripheral surface of the carry roller 52 and then is fed to the developer material coating region while carried on the carry roller.

The support member feeding unit comprises a counter electrode roller 53, which is supplied with a voltage having the opposite polarity to that of the charged developer material from a D.C. power source, a pair of guide rollers 55 provided away from the counter roller 53 and a carry belt 54 such as an endless belt for feeding the support member to the developer material coating region while carrying the support member P thereon and discharging the support member coated with the developer material (developer sheet) to the outside of the coating apparatus, the carry belt 54 being suspended among the counter roller 53 and the guide rollers 55. In FIG. 1, since the developer material S is positively charged, the counter electrode roller 53 is supplied with a negative voltage.

The support member P carried on the carry belt 54 is fed to the developer material coating region by the rotation of the counter roller 53 and the guide rollers 55. The positively-charged developer material S on the carry roller 52 is electrostatically attracted toward the counter electrode roller 53 due to an electric field which is caused between the counter roller 53 having a positive potential and the grounded carry roller 52. That is, particles of the positively-charged developer material S is electrostatically attracted (flight) toward the counter electrode roller 53 in the developer material coating region where the counter roller 53 and the carry roller 52 are confronted to each other, and attach to the support member P to form a developer material layer m on the support member P, that is, a developer sheet.

In the conventional developer material coating apparatus thus constructed, the developer material S, which has been electrostatically attracted toward to the counter electrode roller, is liable to be attached to any portion of carry belt 54, for example, the surface thereof located between the neighboring support members which are successively fed to the carry roller. Further, if the carry belt 54 has a hole in the surface thereof and a damaged portion therein, then the developer material is also attached to the surface of the counter electrode roller 53 through the hole and so on. Still further, if the counter electrode roller 53 is so designed as to have a longer width than the carry belt 54, then the developer material S is also attached to the surface of the counter electrode roller 53 through the side portion of the carry belt 54. Once the developer material S is attached to the surfaces of the carry belt 24 and the counter electrode roller 53, it is very difficult to remove the developer material S from the carry belt 24 and the counter electrode roller 53 because of nonconductivity of the developer material S. Accordingly, the developer material S is liable to be stacked on the surfaces of the carry belt 24 and the counter electrode roller 53. The stacking of the developer material S on the carry belt and the counter electrode roller 53 prevents a gap between the support member P and at least one of the carry belt and the counter electrode roller 53 from having a regular interval (that is, a gap interval between the counter electrode roller 53 and the support member is not constant over the surface of the support member P) and therefore the developer material S is not uniformly coated over the surface of the support member P. When the microcapsule sheet and the support member coated unevenly with the developer material on the surface thereof (that is, the support member coated with a developer material layer having an uneven thickness) are pressure-developed in the pressure-developing unit while contacted with each other, an image having uneven image density is obtained.

SUMMARY OF THE INVENTION

An object of this invention is to provide a developer material coating apparatus in which the developer material attached to the counter electrode roller and the carry roller is easily and suitably removed therefrom and the interval of a gap between the support member and at least one of the counter electrode roller and the carry belt is kept to be constant, so that the developer material is uniformly coated on the support member.

To attain the above object, a developer material coating apparatus according to this invention, comprises support member feeding means for feeding the support member to the developer material coating region while carrying the support member thereon, developer material coating means for triboelectrically charging the developer material and electrostatically supplying the charged developer material toward the support member feeding means to coat the developer material on the surface of the support member in the developer material coating region, and developer material removing means having a suction port for sucking and removing the developer material attached to the support member feeding means, except for the developer material attached to the surface of the support member, the developer material removing means being disposed such that the suction port confronts the support member feeding means.

The developer material removing means comprises an air nozzle having the suction port at one end thereof for sucking the developer material attached to the support member feeding means under a negative pressure, a trap base intercommunicating with said air nozzle for withdrawing the sucked developer material through the air nozzle, an air filter provided in the trap case for trapping the sucked developer material and a negative pressure producing unit intercommunicating with the trap case for producing a negative pressure in the air nozzle to produce an air flow in a predetermined direction.

DETAILED DESCRIPTION OF THE INVENTION

The preferred embodiments of this invention will be described hereunder with reference to the accompanying drawings.

Figure 2:
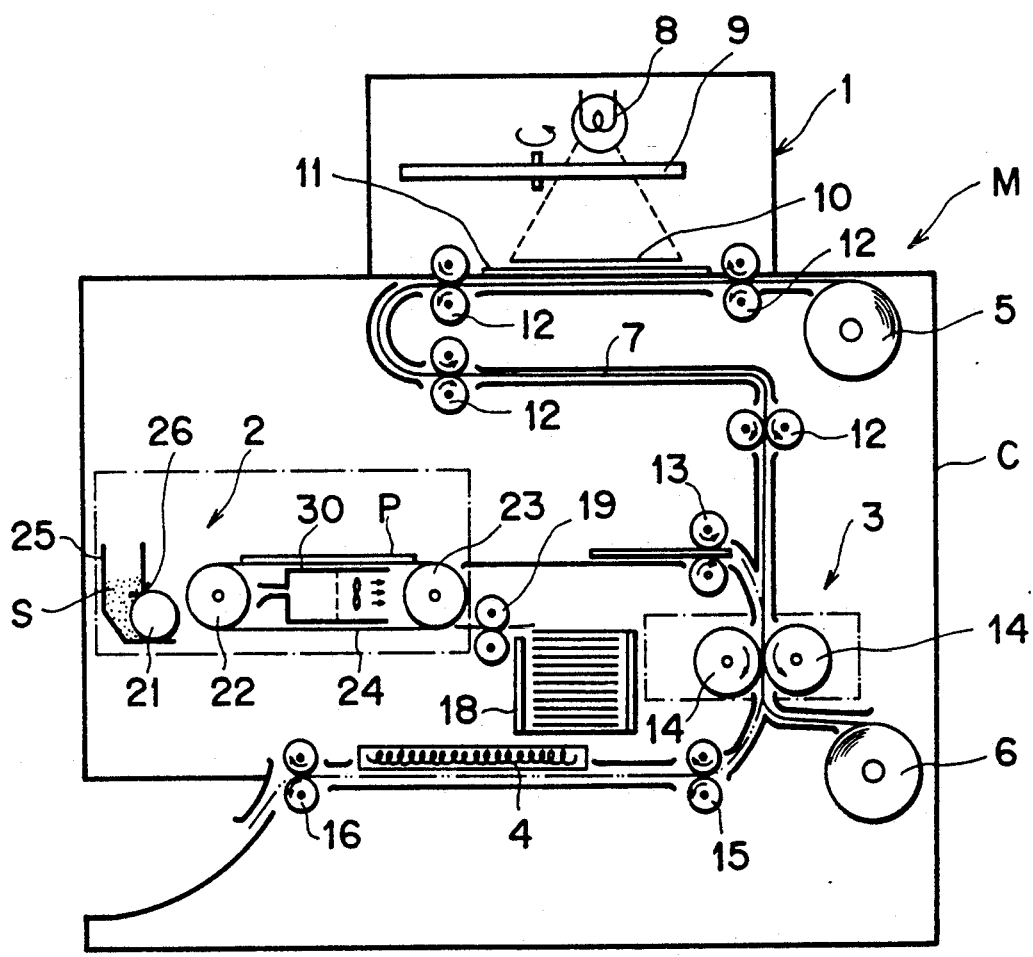
FIG. 2 shows an image recording apparatus equipped with the developer material coating apparatus of this invention.

FIG. 2 shows a color image forming apparatus M provided with the developer material coating apparatus of this invention.

The color image forming apparatus M comprises an exposure unit 1 provided at an upper portion of the apparatus for exposing a microcapsule (photosensitive and pressure-sensitive) sheet 7 to light through an original 10 to form a latent image on the microcapsule sheet 7, and a casing C for accommodating the microcapsule sheet 7 which travels between a sheet supply roller 5 and a sheet take-up roller 6, the developer material coating apparatus 2 provided substantially at the center of the casing M for producing a developer sheet from a support member P and developer material, a pressure-developer unit 3 provided beside the coating apparatus 2 for performing a pressure-developing process and so on.

In the pressure-developing unit 3, the microcapsule sheet 7 which has been exposed to the light from the original is contacted under pressure with the developer sheet formed in the coating apparatus 2, to thereby develop the latent image on the microcapsule sheet 7 into a visible image on the developer sheet. After this pressure-developing process, the developer sheet is separated from the microcapsule sheet and fed to a heat-fixing unit 4 to thermally fix the visible image on the developer sheet.

The exposure unit 1 includes a halogen lamp 8 and a rotatable color separation filter unit 9 provided below the halogen lamp 8 for passing a light emitted from the halogen lamp 9 therethrough and separating the light onto three primary color components. Below the color separation filter unit 9, the original 10 is disposed on an original stand 11. Further, two pairs of first and second guide rollers 12 are provided beside both sides of the original stand 11 (beside the right and left sides of the original in the FIG. 2) and other guide rollers 12 are further provided downstream of the second guide rollers 12 along a sheet feed path.

The microcapsule sheet 7 is drawn out of the sheet supply roll 5 and is fed through the first guide rollers 12 to the original stand 11 for an exposure process to form the latent image corresponding to an original image on the microcapsule sheet 7. The microcapsule sheet having the latent image thereon is further fed through the second guide rollers 12 and the other guide rollers 12 to the pressure-developing unit 3.

A stack of plural support members such as plain paper are accommodated in a cassette 18 for accommodating the support members. A topmost support member is picked up from the stack of the support members and fed through a pair of guide rollers 19 to the carry belt 24 of the developer material coating apparatus 2. The support member P carried on the carry belt 24 is fed to the developer material coating region so that the developer material is coated on the support member to form a developer sheet. The developer sheet which has been formed in the developer material coating apparatus 2 in a manner as described hereinafter is fed through a pair of guide rollers 13 to a gap between a pair of pressure rollers 14 of the pressure-developing unit 3 while superposed on the microcapsule sheet 7. The pressure development is conducted on these superposed sheets under a pressure of the pressure rollers 14.

The microcapsule sheet 7 passed through the pressure-developing unit 3 is taken up by the sheet take-up roller 6. On the other hand, the developer sheet passed through the pressure-developing unit 3 is fed through a pair of guide rollers 15 to the heat-fixing unit 4, and the discharged through a pair of guide rollers 16 to an outside of the apparatus.

Figure 3:
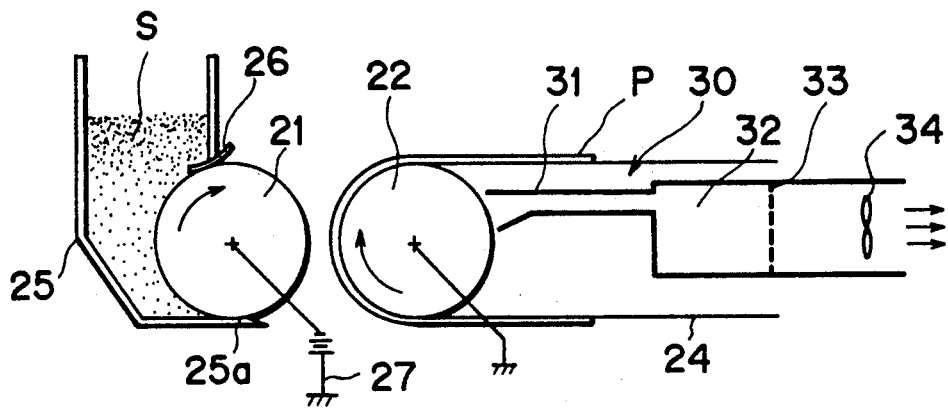
FIG. 3 shows a first embodiment of the developer material coating apparatus according to this invention.

FIG. 3 shows a first embodiment of the developer material coating apparatus of this invention.

Figure 1:
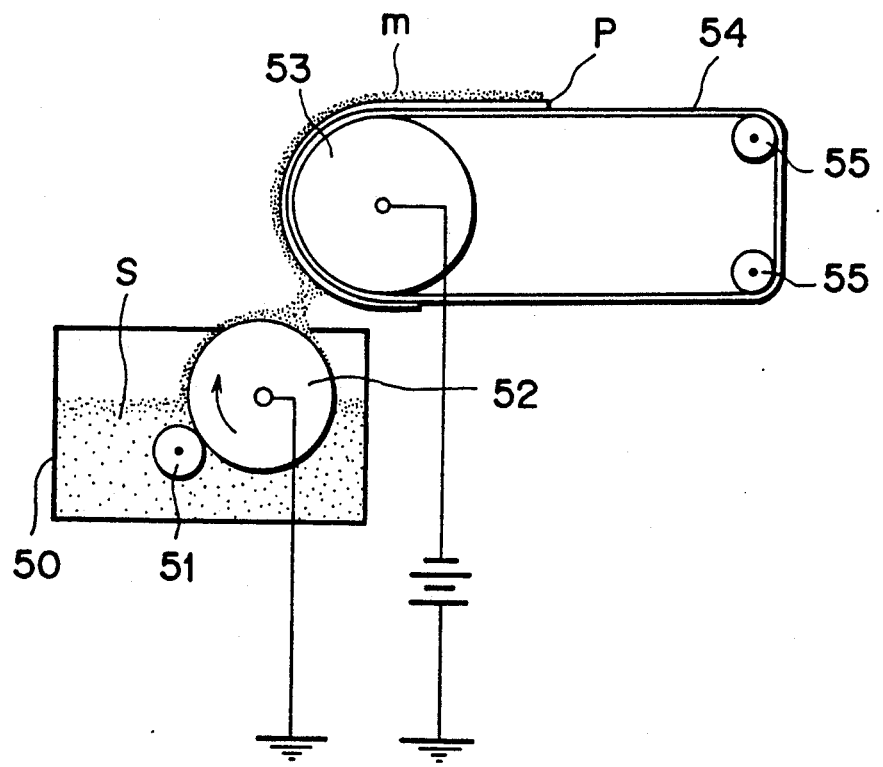
FIG. 1 shows a conventional developer material coating apparatus.

Like the developer material coating apparatus as shown in FIG. 1, the developer material coating apparatus of this embodiment includes a support member feeding unit and a developer material coating unit. The support member feeding unit comprises a counter electrode roller 22 for electrostatically attract the developer material S, a pair of guide rollers 40 and a carry belt 24 suspended among the counter electrode roller 22 and the guide rollers 40 for feeding the support member P to the developer material coating region while carrying the developer material S on the outer surface thereof. The developer material coating unit comprises a tank 25 for accommodating the granular developer material S therein and a carry roller 21 provided at a side portion of the tank 25 for carrying thereon and feeding the developer material S to the developer material coating region.

In the developer material coating apparatus of this embodiment, a blade 26 for smoothing the developer material S carried on the carry roller 21 is provided at an upper side of the carry roller 21 in such a manner as to contact with the carry roller 21 and a removing blade 25a is provided at one side of a bottom plate of the tank 25 in such a manner as to be spaced at a predetermined interval away from carry roller 21. The carry roller 21 is supplied with a negative voltage from a voltage source 27 to keep the carry roller 21 at a negative potential, while the counter electrode roller 22 is grounded. Further, both of the carry roller 21 and the counter electrode roller 22 are clockwisely rotated by a rotation mechanism such as a motor (not shown).

The counter electrode roller 22 and the carry roller 1 are spaced at a predetermined interval in the developer material coating region, and the support member P, which is picked up from the cassette 18 and fed through the rollers 9 as shown in FIG. 2, is fed through the developer material coating region while contacted with the counter electrode roller 22 through the carry belt 24. The granular developer material S in the tank 25 is drawn in a gap between the blade 26 and the carry roller 21 by a clockwise rotation of the carry roller 21, and triboelectrically negatively charged with friction between the carry roller 21 and the developer material S. The negatively charged developer material S is carried on the carry roller 21 while smoothed by the blade 26, and fed to the developer material coating region.

In the developer material coating apparatus according to this embodiment, an air conveyor serving as developer material removing means is further provided to the support member feeding unit. In this embodiment, the air conveyor 30 is provided at an inner space of the supports member feeding unit which is defined between the counter electrode roller 22, the guide rollers 40 and the inner surface of the carry belt 24. The air conveyor 30 includes a suction nozzle 31 for sucking the developer material attached to the surface of the counter electrode roller 22 under negative pressure, a trap case 32 connected to the suction nozzle 31 for withdrawing the developer material S removed from the counter electrode roller 22 by the nozzle 31, a trap filter 33 for trapping the sucked developer material S, and a ventilating fan 34 for producing a negative pressure. The suction nozzle 31 is disposed near the upper portion of the counter electrode roller 22 in the inner space in such a manner as to confront the surface of the counter electrode roller 22. With the negative pressure produced by the ventilating fan 34, the developer material S attached to the counter electrode roller 22 is sucked through the suction nozzle 31 to the trap case 32, and withdrawn therein while trapped by the trap filter 33.

The operation of the developer material coating apparatus thus constructed will be described hereunder.

When the carry roller 21 is clockwisely rotated, the granular developer material S is drawn in the gap between the blade 26 and the surface of the carry roller 21, and tribelectrically charged due to the friction. The charged developer material S is carried on the carry roller 21 and then fed to the developer material coating region where the carry roller 21 confronts the counter electrode roller 22. As the carry roller 21 is supplied with the negative voltage and the counter electrode roller 22 is grounded, an electric field occurs between the carry roller 21 and the counter electrode roller 22. The charged (in this case, the negatively-charged) developer material S carried on the carry roller 21 is electrostatically attracted toward the counter electrode roller 22 with the electric field and then coated on the support member P. In this case, the charged developer material S is also attached to any portion (for example, the surface) of the carry belt 24 located between the successively-supplied neighboring support members P to the developer material coating region, and then is attached to the surface of the counter electrode roller 22 through the carry belt 24.

By the rotation of the counter electrode roller 22, the erroneously attached developer material to the counter electrode roller 22 is fed to a developer material removing region where the counter electrode roller 22 and the suction nozzle 31 are confronted with each other. An air flow directing from the suction nozzle 31 to the trap case 32 occurs, that is, a negative pressure occurs within the suction nozzle 31 by the ventilating fan 34 provided at the rear side of the trap case 32. Accordingly, the developer material S attached to the counter electrode roller 22 is sucked from the surface of the counter electrode roller 22 into the suction nozzle 31 under the negative pressure, and then trapped in the trap case 32 by the trap filter 33.

Figure 4:
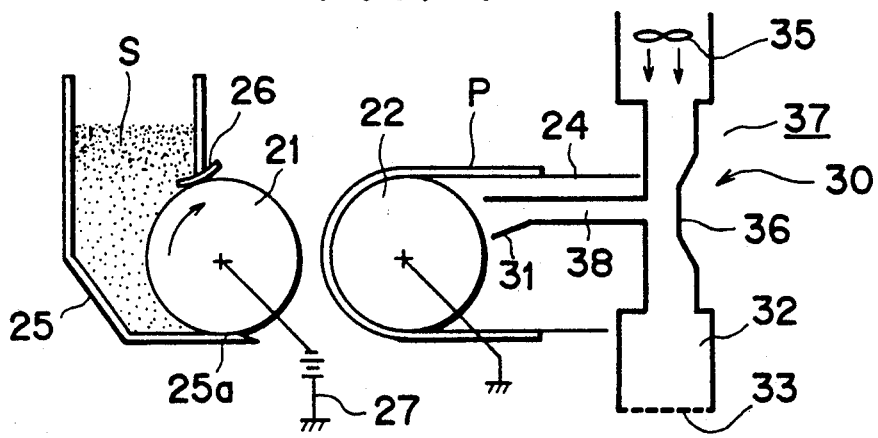
FIG. 4 shows a second embodiment of the developer material coating apparatus according to this invention.

FIG. 4 shows a second embodiment of the developer material coating apparatus as shown in FIG. 3. The elements having the same functions as those of the first embodiment are represented by the same reference numerals, and the description thereof is eliminated.

The air conveyor of this embodiment comprises a blower 35 for blowing an air, a trap case 32 having a trap filter 33 therein, an air tube 37 having one end connected to the blower 35 and the other end connected to the trap case 32 provided at the other end thereof and a trap filter 33, and a nozzle tube 38 having an air nozzle 31 at one end thereof. The air tube 37 is so designed as to be constricted at any position of the elongated side wall, for example, at the middle portion thereof, and the other end of the nozzle tube 38 is connected to the constricted portion of the air tube 37 in such a manner as to project from the elongated side wall of the air tube.

In the air conveyor thus constructed, an air flow produced by the blower 35 is directed through the constricted portion to the trap case 32. In this case, the air flow is accelerated by the contracted portion of the air tube 37, and thus a pressure at the contracted portion is reduced. As a result, the air nozzle 31 has a negative pressure therein. Accordingly, the developer material S attached to the counter electrode roller 22 is fed to the developer material removing region by the rotated on the counter electrode roller 22, and sucked into the air nozzle 31 under the negative pressure. The sucked developer material S is directed to the trap case 32 along the air flow and trapped in the trap case 32.

Figure 5:
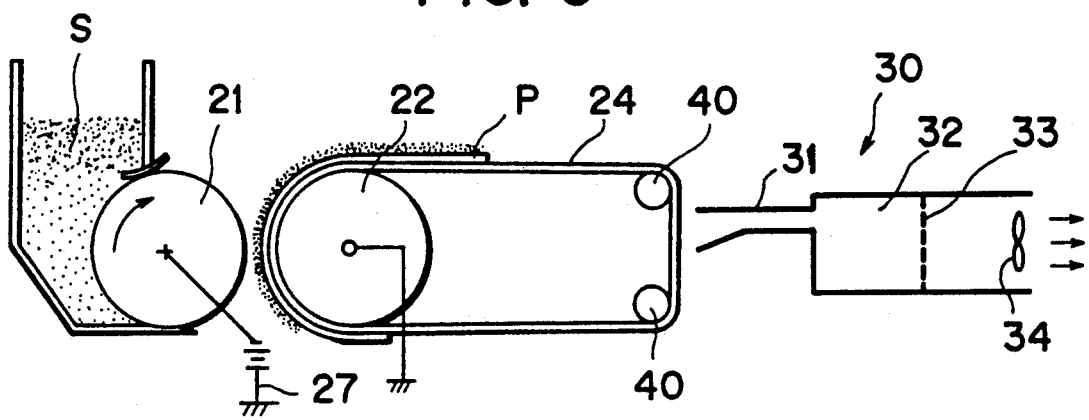
FIG. 5 shows a third embodiment of the developer material coating apparatus according to this invention.

FIG. 5 shows a third embodiment of the developer material coating apparatus according to this invention. The elements having the same functions as those of the first embodiment are represented by the same reference numerals, and the description thereof is eliminate.

In this embodiment, the air conveyor 30 as shown in FIG. 3 is disposed at a rear side of the support member feeding unit such that the air nozzle 31 of the air conveyor 30 confronts an non-feeding region of the carry belt 24 which is defined by a region between the pair of guide rollers 40. Like the first embodiment, the air nozzle 31 is connected to the trap case 32, and the ventilating fan 34 for producing the negative pressure is provided at the rear side of the trap case 32 ( that is, at the opposite side to the air nozzle 31 with respect to the trap case 32).

In this embodiment, the developer material S is attached to any portion (for example, the surface) of the carry belt 24 located between the neighboring support members P in the developer material coating region, and then is fed to the non-feeding region where the carry belt 24 confronts the air nozzle 31. As the air flow directing to the trap case 32 occurs within the air nozzle, the developer material S attached to the carry belt 24 is sucked through the air nozzle 31 to the trap case 32 along the air flow, and trapped in the trap case 32.

In this invention, each of the air conveyors of the first to third embodiments is individually used. However, the air conveyors may be used in combination.

As described above, according to the developer material coating apparatus of this invention, the developer material S stacked on the carry roller and the surface of the counter electrode roller are easily and suitably removed therefrom to keep constant a gap interval between the support member P and at least one of the carry roller and the counter electrode roller 22, so that the developer material is uniformly coated over the surface of the support member. Accordingly, when the developer sheet coated with the developer material and the exposed microcapsule sheet is pressure-developed while contacted with each other under pressure, irregularity (ununiformity) in the image density of an obtained image can be completely prevented.

I claim:

1. A developer material coating apparatus for electrostatically coating developer material on a support member such as plain paper in a developer material coating region to form a developer sheet, comprising:

support member feeding means for feeding the support member to the developer material coating region while carrying the support member thereon, said support member feeding means having a mounting surface for mounting said support member;

developer material coating means for triboelectrically charging the developer material and electrostatically supplying the charged developer material toward said support member feeding means to coat the developer material on the surface of the support member in the developer material coating region; and developer material removing means having a suction port for sucking and removing substantially all the developer material attached to said support member feeding means, except for the developer material attached to the surface of the support member, said developer material removing means being disposed such that said suction port confronts and sucks developer from said support member feeding means.

2. A developer material coating apparatus as claimed in claim 1, wherein said developer material removing means comprises an air nozzle having said suction port at one end thereof for sucking the developer material attached to said support member feeding means under a negative pressure, a trap case intercommunicating with said air nozzle for withdrawing the sucked developer material through said air nozzle, an air filter provided in said trap case for trapping the sucked developer material and a negative pressure producing unit intercommunicating with said trap case for producing a negative pressure in said air nozzle to produce an air flow in a predetermined direction.

3. A developer material coating apparatus as claimed in claim 2, wherein said negative pressure producing unit comprises a ventilating fan provided at a downstream side of said trap case in the predetermined direction of the air flow.

4. A developer material coating apparatus as claimed in claim 2, wherein said negative pressure producing unit comprises a blower for blowing an air to said trap case to produce the air flow and an air tube having one end connected to said trap case, the other end connected to said blower and a constricted portion at an elongated side wall thereof, the negative pressure being produced by acceleration of the air flow in the contracted portion, and wherein the other end of said air nozzle is connected to the constricted portion in such a manner as to project from the side portion of said air tube.

5. A developer material coating apparatus as claimed in claim 1, wherein said support member feeding means comprises a counter electrode roller for electrostatically attracting the charged developer material from said developer material coating means in the developer material coating region, a pair of guide rollers and a carry belt suspended among said counter electrode roller and said guide rollers for feeding the support member to the developer material coating region while carrying the support member at the outer surface thereof, and wherein said developer material coating means comprises a tank for accommodating the developer material and a carry roller provided at the side portion of said tank for carrying thereon and feeding the charged developer material to the developer material coating region.

6. A developer material coating apparatus as claimed in claim 5, wherein said developer material coating means further comprises a blade contacted with the surface of said carry roller to smooth the developer material on said carry belt while triboelectrically charging the developer material in cooperation with said carry roller.

7. A developer material coating apparatus as claimed in claim 5, wherein said developer material coating means further comprises a removing blade for removing the charged developer material on said carry roller.

8. A developer material coating apparatus as claimed in claim 5, wherein said carry roller is supplied with a negative voltage and said counter electrode roller is grounded, thereby producing an electric field between said carry roller and said counter electrode roller to electrostatically attract the charged developer material from said carry roller toward said counter electrode roller with the electric field.

9. A developer material coating apparatus as claimed in claim 1, wherein said support member feeding means includes a counter electrode roller for electrostatically attracting the charged developer material from said developer material coating means in the developer material coating region, a pair of guide rollers and a carry belt suspended among said counter electrode roller and said guide rollers for feeding the support member to the developer material coating region while carrying the support member at the outer surface thereof.

10. A developer material coating apparatus as claimed in claim 9, wherein said developer material removing means sucks and removes the developer material attached to said counter electrode roller.

11. A developer material coating apparatus as claimed in claim 10, wherein said suction port is disposed in a space between said counter electrode roller, said guide rollers and the inner surface of said carry belt in such a manner as to confront the surface of said counter electrode roller.

12. A developer material coating apparatus as claimed in claim 9, wherein said developer material removing means sucks and removes the developer material attached to a surface of said carry belt.

13. A developer material coating apparatus as claimed in claim 12, wherein said suction port is disposed between said guide rollers in such a manner as to confront the outer surface of said carry belt.

14. A developer material coating apparatus for electrostatically coating developer material on a support member such as plain paper in a developer material coating region to form a developer sheet, comprising:
 support member feeding means for feeding the support member to the developer material coating region while carrying the support member thereon, said support member feeding means having a mounting surface for mounting said support member;
 wherein said support member feeding means comprises a counter electrode roller for electrostatically attracting the charged developer material from said developer material coating means within the developer material coating region, a pair of guide rollers and a carry belt suspended among said counter electrode roller and said guide rollers for feeding the support member to the developer material coating region while carrying the support member at the outer surface thereof;
 developer material coating means for triboelectrically charging the developer material and electrostatically supplying the charged developer material toward said support member feeding means to coat the developer material on the surface of the support member in the developer material coating region, said developer material coating means comprising a tank for accommodating the developer material and a carry roller provided at the side portion of said tank for carrying thereon and feeding the charged developer material to the developer material coating region; and
 developer material removing means having a suction port for sucking and removing substantially all the developer material attached to said support member feeding means, except for the developer material attached to the surface of the support member, said developer material removing means being disposed such that said suction port confronts and sucks developer from said support member feeding means.

15. A developer material coating apparatus as claimed in claim 14, wherein said developer material removing means sucks and removes the developer material attached to said counter electrode roller.

16. A developer material coating apparatus as claimed in claim 15, wherein said suction port is disposed in a space between said counter electrode roller, said guide rollers and the inner surface of said carry belt in such a manner as to confront the surface of said counter electrode roller.

17. A developer material coating apparatus as claim in claim 14, wherein said developer material removing means sucks and removes the developer material attached to a surface of said carry belt.

18. A developer material coating apparatus as claimed in claim 17, wherein said suction port is disposed between said slide rollers in such a manner as to confront the outer surface of said carry belt.

* * * * *